United States Patent
Kim et al.

(10) Patent No.: US 7,632,611 B2
(45) Date of Patent: Dec. 15, 2009

(54) METHOD OF MANUFACTURING RIM TYPE OF PHOTOMASK AND PHOTOMASK MADE BY SUCH METHOD

(75) Inventors: Chang-hwan Kim, Suwon-si (KR); Gi-sung Yoon, Suwon-si (KR); Sun-young Choi, Seoul (KR); Chan-uk Jeon, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 492 days.

(21) Appl. No.: 11/434,868

(22) Filed: May 17, 2006

(65) Prior Publication Data
US 2007/0020533 A1    Jan. 25, 2007

(30) Foreign Application Priority Data
Jul. 25, 2005    (KR) ..................... 10-2005-0067286

(51) Int. Cl.
*G03F 1/00*    (2006.01)
(52) U.S. Cl. .............................. 430/5; 430/311; 430/313
(58) Field of Classification Search .................. 430/5, 430/311; 716/19, 21
See application file for complete search history.

(56) References Cited

U.S. PATENT DOCUMENTS 5,824,439 A * 10/1998 Lee ................................ 430/5

2005/0069788 A1 * 3/2005 Tanaka et al. ................... 430/5

FOREIGN PATENT DOCUMENTS

| JP | 06-266096 | 9/1994 |
| JP | 07-140633 | 6/1995 |
| KR | 100223812 B1 | 7/1999 |
| KR | 1020040003653 A | 1/2004 |

* cited by examiner

*Primary Examiner*—Stephen Rosasco
*Assistant Examiner*—Rashid Alam
(74) *Attorney, Agent, or Firm*—Volentine & Whitt, PLLC

(57) ABSTRACT

A method of forming a rim type of photomask prevents a chrome pattern formed in the 0°-phase shift region of the mask substrate from being irregular and hence, ensures that the border of the 0°-phase shift region has a uniform width. First, a light blocking layer is formed on a quartz substrate. A select portion of the light blocking layer is etched to form a patterned light blocking layer, and the underlying quartz substrate is etched to a predetermined depth to form a 180°-phase shift region. Then, a fluid material layer is formed on the quartz substrate without an electron beam lithography process. The fluid material layer covers a central portion of the patterned light blocking layer and leaves an outer peripheral portion of the patterned light blocking layer exposed. Subsequently, the patterned light blocking layer is etched using the fluid material layer as a mask to form a light blocking pattern and to expose the substrate along a border adjacent the 180°-phase shift region. Finally, the fluid material layer is removed.

19 Claims, 6 Drawing Sheets

METHOD OF MANUFACTURING RIM TYPE OF PHOTOMASK AND PHOTOMASK MADE BY SUCH METHOD

BACKGROUND OF THE INVENTION

1. Field of the Invention

The present invention relates to a method of manufacturing a photomask. More particularly, the present invention relates to a method of manufacturing a rim type of photomask.

2. Description of the Related Art

In general, an exposure apparatus for use in forming a circuit pattern on a semiconductor substrate includes a mask or reticle having a mask pattern corresponding to the circuit pattern that is to be formed, an exposure light source for illuminating the mask or reticle with an exposure light so that an image of the pattern of the mask or reticle is picked up by the exposure light, and a pupil lens for condensing the exposure light onto a photoresist on the semiconductor substrate. In this way, an image of the pattern of the mask or reticle is transferred to the photoresist on a reduced scale. Then, the photoresist is developed to selectively remove the exposed or unexposed portions thereof such that a photoresist pattern is formed on the semiconductor substrate.

One known type of mask or reticle is a binary mask. An ordinary binary mask consists of a quartz substrate and an opaque pattern(light blocking layer), for ample, a chrome pattern, disposed on the quartz substrate. However, if a line width of the opaque pattern is smaller than the wavelength ($\lambda$) of the exposure light, the angle of diffraction of the exposure light passing through the mask is too great for the exposure light to be focused on the pupil lens of the exposure apparatus, and the image being transferred by the diffracted light will not have a sufficient amount of contrast. Therefore, it is problematic to use a binary mask having an opaque pattern to form a fine circuit pattern, i.e., a circuit pattern having a small line width.

In light of this, phase shift masks using destructive interference have been developed. The phase shift masks are classified as follows: attenuated phase shift masks having a 180°-phase shift region formed of a phase shift material, for example, MoSiON, which transmits a small percentage of the exposure light; alternating phase shift masks having a 180°-phase shift region and a chrome layer formed in a trench in the quartz substrate; chromeless phase shift masks having 0°- and 180°-phase shift regions formed at different depths in the quartz substrate, e.g., and in which the 0°-phase shift region is constituted by the surface of the quartz substrate whereas the 180°-phase shift region is constituted by a trench in the substrate; and rim type of photomasks (hereinafter, referred to as rim masks) in which a chrome pattern is disposed on a 0°-phase shift region of what would otherwise be a chromeless phase shift mask.

Figure 1:
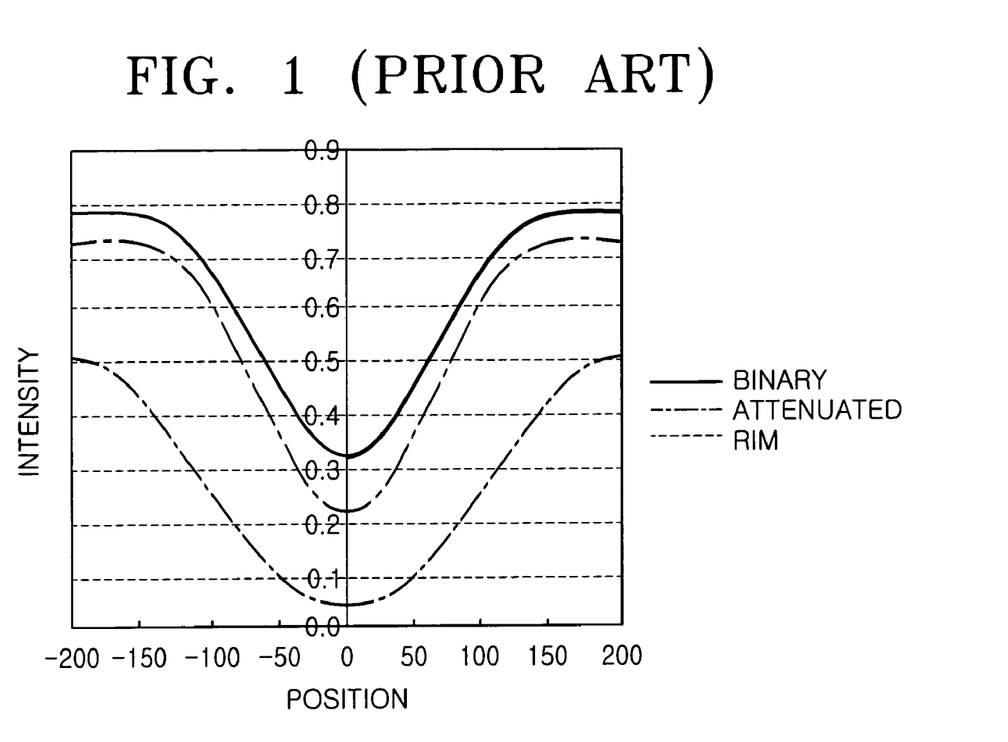
FIG. 1 is a graph illustrating the contrast that can be provided by three different types of photomasks.

FIG. 1 is a graph illustrating the contrasts of the images transferred by various types of photomasks. Referring to FIG. 1, the rim mask can provide a higher degree of contrast than the binary mask and the attenuated phase shift mask. That is, the rim mask provides the highest and lowest intensities in the light transmitted therethrough, and thus can be used to form the finest photoresist pattern among the three masks.

Figure 2:
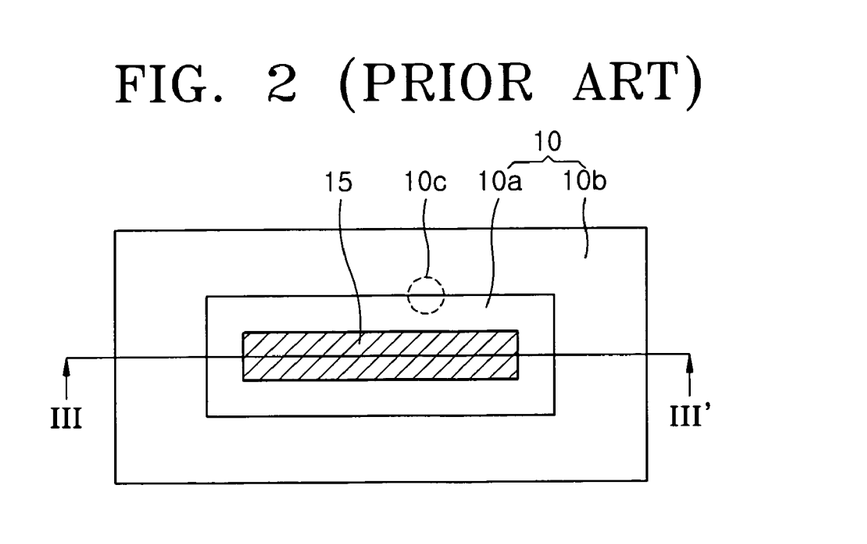
FIG. 2 is a top view of a conventional rim type of photomask.

FIG. 2 is a top view of a conventional rim mask. Referring to FIG. 2, the rim mask includes a quartz substrate 10 having 0°-phase shift and 180°-phase shift regions 10a and 10b. The 0°-phase shift region 10a is defined by the surface of the quartz substrate 10 and the 180°-phase shift region 10b is defined by a trench having a predetermined depth in the quartz substrate 10. In addition, the rim mask includes a chrome pattern 15 on the 0°-phase shift region 10a. Also, the chrome pattern 15 leaves a border 10c of the 0°-phase shift region 10a exposed adjacent the 180°-phase shift region 10b. The rim mask is manufactured as shown in FIGS. 3A through 3C.

Figure 3A:
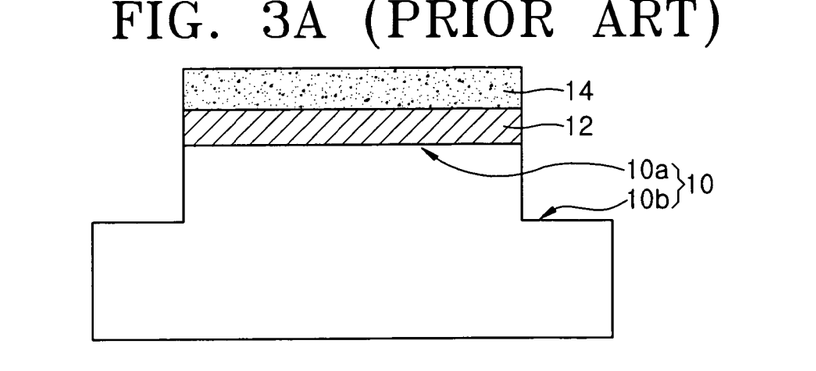
FIGS. 3A through 3C are cross-sectional views of a substrate taken in the direction of line III-III' of FIG. 2 and illustrating a conventional method of manufacturing the rim type of photomask of FIG. 2.

Referring first to FIG. 3A, a chrome layer is formed on the quartz substrate 10. A first photoresist pattern 14 is formed on the chrome layer using electron beam lithography. The chrome layer is etched to attain the shape of the first photoresist pattern 14. In addition, the quartz substrate 10 is etched to a predetermined depth using the first photoresist pattern 14 and the etched chrome layer 12 as a mask to define the 180°-phase shift region 10b. Accordingly, the 0°-phase shift region 10a is defined as well.

Figure 3B:
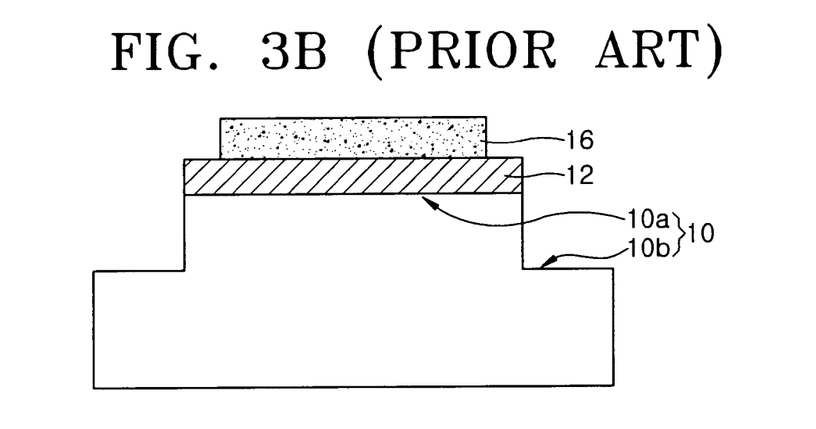

Referring to FIG. 3B, the first photoresist pattern 14 is removed. Next, a photoresist layer is formed on the resultant structure and is etched using electron beam lithography to form a second photoresist pattern 16 on the etched chrome layer 12. The second photoresist pattern 16 exposes an outer peripheral portion of the etched chrome layer 12, i.e., corresponding to the border 10c of the 0°-phase shift region 10a.

Figure 3C:
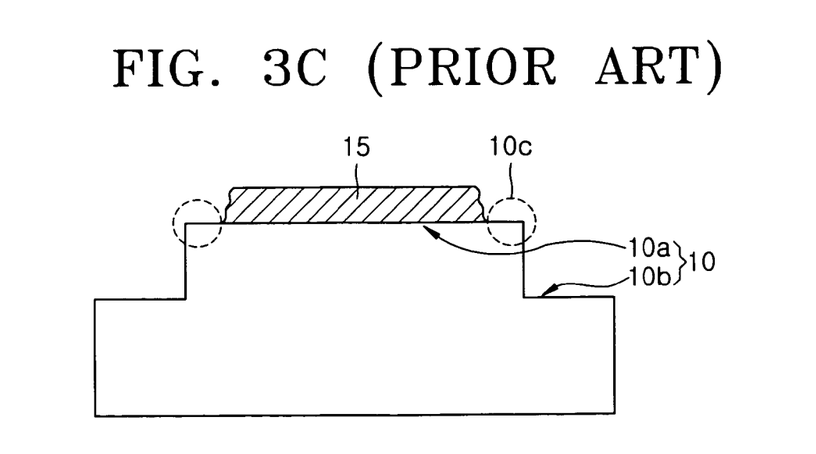

Referring to FIG. 3C, the chrome layer 12 is etched once more using the second photoresist pattern 16 as a mask to form a chrome pattern 15 that exposes the quartz substrate 100 at the border 10c. Then, the second photoresist pattern 16 is removed.

However, the following problems arise when manufacturing the rim mask.

First, the second photoresist pattern 16 is theoretically designed to define the border 10c. However, it is very difficult to align the second photoresist pattern 16 on the etched chrome layer 12 such that a peripheral region of the etched chrome layer 12, corresponding precisely to the border 10c, is left exposed by the second photoresist pattern 16. In addition, expensive equipment such as electron beam and/or laser equipment is required for rectifying any misalignment which may occur between the second photoresist pattern 16 and the etched chrome layer 12.

Second, the first and second photoresist patterns 14 and 16 are charged with electrons because the first and second layers of photoresist, from which the photoresist patterns 14 and 16 are formed, are exposed using electron beams. The charged electrons are scattered non-uniformly throughout the layers of photoresist when the layers are developed, i.e., patterned. As a result, the first and second photoresist patterns 14 and 16 are irregular. Accordingly, the chrome pattern 15 also is irregular.

A process of exposing the photoresist patterns using a short wavelength laser has been suggested as a way to prevent the photoresist layers from being charged. However, such a laser provides inferior exposure in a region that has a dimension on the order of microns, such as the region corresponding to the border 10c. A process of employing a conductive polymer in order to discharge the electrons has also been suggested, but is expensive and complicated.

SUMMARY OF THE INVENTION

An object of the present invention is to provide a method of manufacturing a rim mask whose rim adjacent a 180°-phase shift region has a uniform width. Likewise, an object of the present invention is to provide a rim mask whose rim has a uniform width.

Another object of the present invention is to provide a relatively simple method of manufacturing a rim mask, and that does not require the need for relatively expensive processing equipment.

A more specific object of the present invention is to provide a method of manufacturing a rim mask without a plurality of electron beam lithography processes.

According to an aspect of the present invention, there is provided a method of manufacturing a rim type of photomask including: forming a light blocking layer on a quartz substrate, forming a 180°-phase region by patterning the light blocking layer and etching the quartz substrate to a predetermined depth, depositing a fluid material having poor step coverage on the quartz substrate to thereby form a fluid material layer that covers a central portion of the patterned light blocking layer and leaves an outer peripheral portion of the patterned light blocking layer exposed; etching the patterned light blocking layer using the fluid material layer as a mask, and removing the fluid material layer.

According to another aspect of the present invention, there is provided a method of manufacturing a rim type of photomask including: forming a light blocking layer on a quartz substrate, forming a 180° phase region by patterning the light blocking layer and etching the quartz substrate to a predetermined depth, forming a photoresist layer, that covers a central portion of the patterned light blocking layer and leaves an outer peripheral portion of the patterned light blocking layer exposed without charging the photoresist layer with electrons, etching the patterned light blocking layer using the photoresist layer as a mask, and removing the photoresist layer.

The thickness of the photoresist layer may be 1000 to 5000 Å.

Also, the width of the outer peripheral portion of the patterned light blocking layer that is exposed can be changed, i.e., increased, between the forming of the photoresist layer and the etching of the light blocking layer. To this end, the photoresist layer may be treated using an oxygen-based plasma or a developing solution.

According to still another aspect of the present invention, there is provided a method of manufacturing a rim type of photomask including: forming a light blocking layer on a quartz substrate, patterning the light blocking layer and etching the underlying quartz substrate to a predetermined depth to form a patterned light blocking layer and 180°-phase shift region constituted by the etched portions of the substrate, forming a photoresist layer on the quartz substrate that covers central portions of respective features of the patterned light blocking layer and leaves outer peripheral portions of the features exposed, disposing a light blocking mask over only a portion of the substrate, removing that portion of the photoresist layer which is not covered by the light blocking mask and thereby leaving a residual portion of the photoresist layer on at least one of the features of the patterned light blocking layer, etching the patterned light blocking layer using the residual portion of the photoresist layer as a mask, and removing the residual portion of the photoresist layer.

According to the present invention, a film having poor step coverage is formed on a quartz substrate having a 180°-phase shift region, and a 0°-phase shift region covered by a patterned light blocking (e.g., chrome) layer. Accordingly, the outer peripheral portion of the patterned light blocking layer can be exposed without subjecting the film to a lithography process such as an electron beam lithography process. The exposed portion of the patterned light blocking layer is then selectively removed using the film as an etch mask to form a light blocking pattern on the 0°-phase shift region and to expose the substrate at the border of the 0°-phase shift region. That is, the rim of the photomask can be formed without charging the film, from which the etch mask is formed, with electrons and developing the film. Thus, the method is relatively simple. Also, the light blocking pattern will have the desired shape, i.e., one that delimits the border of the 0°-phase shift region such that the border has a uniform width.

BRIEF DESCRIPTION OF THE DRAWINGS

The above and other objects, features and advantages of the present invention will become more apparent from the following detailed description of the preferred embodiments thereof made with reference to the attached drawings in which.

DETAILED DESCRIPTION OF THE PREFERRED EMBODIMENTS

Hereinafter, a first embodiment of a method of manufacturing a rim mask according to the present invention will be described in detail with reference to FIGS. 4A through 4C.

Figure 4A:
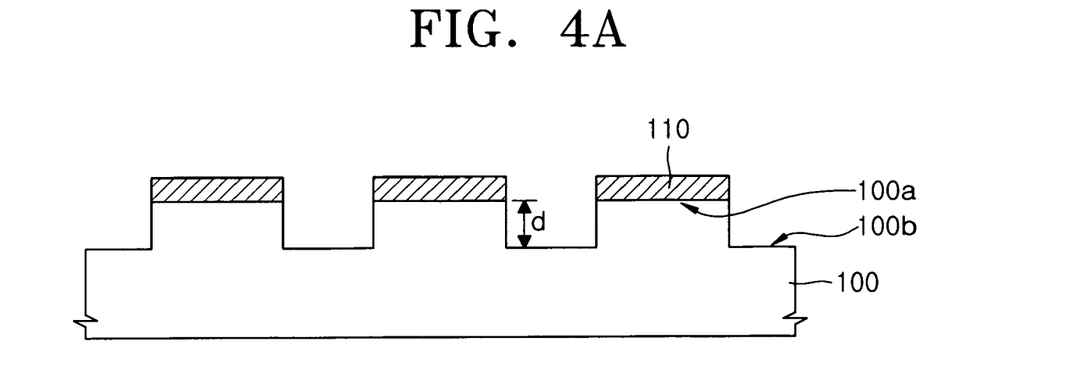
FIGS. 4A through 4C are cross-sectional views of a substrate illustrating an embodiment of a method of manufacturing a rim type of photomask according to the present invention.

Referring first to FIG. 4A, a chrome layer is formed on top of a quartz substrate 100 and a photoresist pattern (not illustrated) is formed on the chrome layer using electron beam lithography. The photoresist pattern exposes a portion of the chrome layer where the 180° phase shift region 100*b* of the rim mask is to be formed. The chrome layer is anisotropically etched using the photoresist pattern as a mask to thereby form a patterned chrome layer 110. The quartz substrate 100 is etched to a predetermined depth d using the patterned chrome layer 110 and the photoresist pattern as a mask to define the 180°-phase shift region 100*b*. The region of the quartz substrate 100 left covered by the patterned chrome layer 110 is a 0°-phase shift region 100*a*. The depth d of the 180°-phase region 100*b* is selected to satisfy the following equation (1).

$$d = \frac{\lambda}{2(\eta - 1)} \quad (1)$$

wherein $\lambda$ is the wavelength of the exposure light and $\eta$ is the refractive index of the substrate 100. Thus, the depth d is almost equal to the wavelength of the exposure light because the refractive index of quartz, i.e., the material of the substrate, is about 1.5. Next, the photoresist pattern is removed.

Figure 4B:
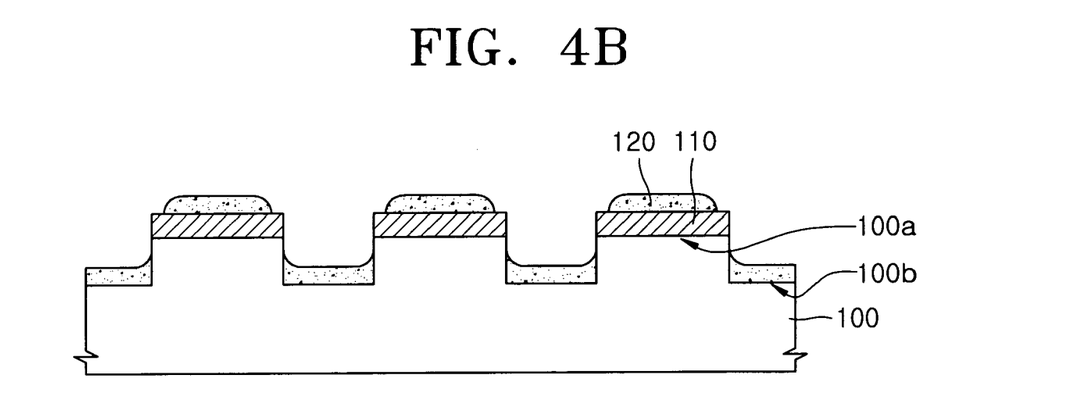

Referring to FIG. 4B, a photoresist layer 120 is formed on the quartz substrate 100. The photoresist layer 120 is thin enough to leave outer peripheral regions of the patterned chrome layer 110 exposed. For example, the photoresist layer 120 is 1000-5000 Å thick. Preferably, the photoresist making up photoresist layer 120 is a liquid-phase polymer having poor step coverage with respect to the topology of the quartz substrate 100. Accordingly, outer peripheral regions of the patterned chrome layer 110 having uniform widths are exposed when the photoresist is deposited on the quartz substrate 100. Therefore, the outer peripheral regions of the patterned chrome layer 110 are exposed without performing an additional lithography process, i.e., without exposing and developing the photoresist layer.

Portions of the photoresist layer 120 may be removed If not enough of the outer peripheral regions of the patterned chrome layer 110 are exposed by the photoresist layer 120. For example, portions of the photoresist layer 120 can be removed by an oxygen plasma process or with a developing solution.

Next, the photoresist layer 120 may be cured.

Figure 4C:
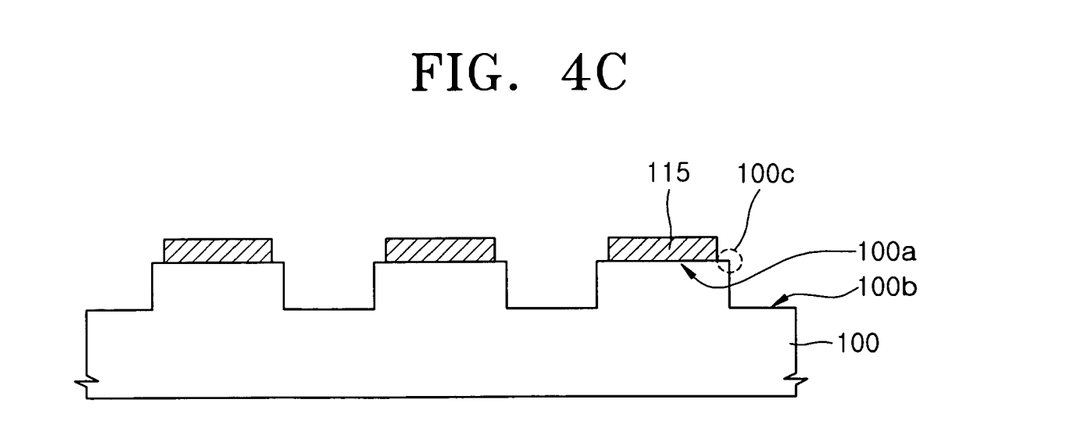

Referring to FIG. 4C, the patterned chrome layer 110 is etched using the photoresist layer 120 as a mask to form a chrome pattern 115 exposing the quartz substrate 100 at the borders 100c of the 0°-phase shift regions 100a, i.e., rims. The chrome layer 110 may be wet etched or dry etched. The ultimate width of each border 100c can be controlled based on the thickness of the photoresist layer 120, the length of time during which the oxygen plasma or developing process is performed, and the length of time during which the patterned chrome layer 110 is etched.

According to the present invention as described above, a thin photoresist layer having poor step coverage is formed on the quartz substrate 100 having the 180°-phase region 100b such that an outer peripheral portion of each feature of the patterned chrome layer 110 is exposed without performing an electron beam lithography process, and wherein the outer peripheral portion has a precise and uniform width. In addition, since one electron beam lithography process can be omitted, an irregular shape of a photomask caused by electron charging can be prevented.

Figure 5A:
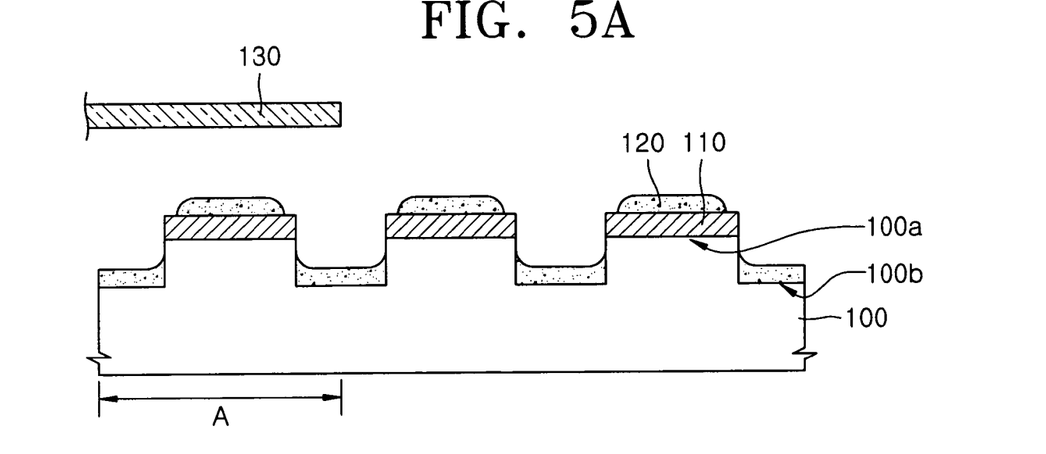
FIGS. 5A through 5C are cross-sectional views of a substrate illustrating a method of manufacturing a rim type photomask according to the present invention.
Figure 5B:
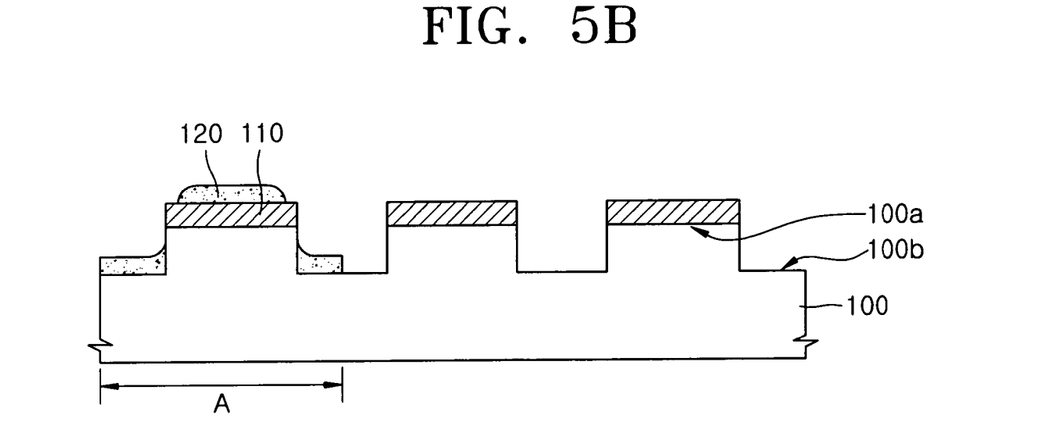
Figure 5C:
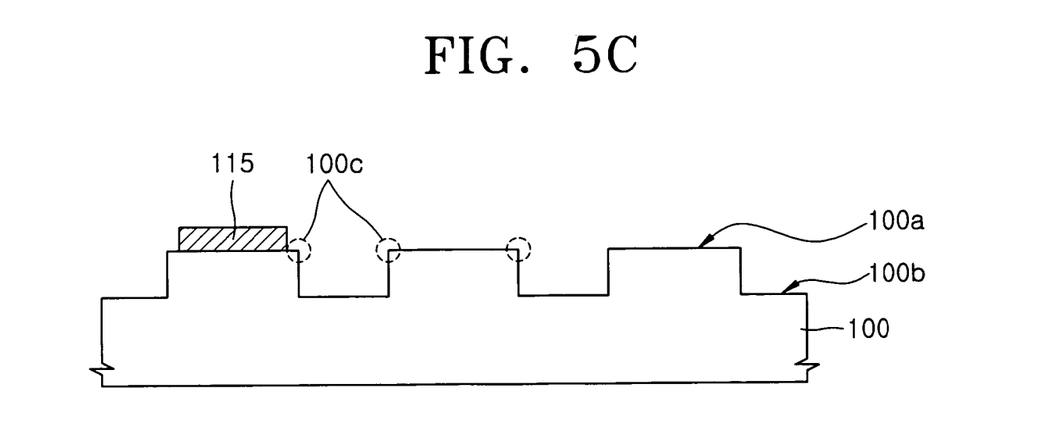

FIGS. 5A through 5C illustrate another embodiment of a method of manufacturing a rim mask according to the present invention.

Referring to FIG. 5A, a chrome layer and a quartz substrate 100 are selectively etched using a first photoresist pattern (not illustrated) as a mask to form 0°-phase shift and 180°-phase shift regions 100a and 100b. Next, a photoresist layer 120 is formed on the quartz substrate 100 so as to expose the outer peripheral regions of the patterned chrome layer 110. The widths of the exposed peripheral regions of the patterned chrome layer 110 can be adjusted by subjecting the photoresist layer to an oxygen plasma etch process or a developing process or the like. Then, a light blocking mask 130 is disposed over a selected area A of the substrate 100.

Referring to FIG. 5B, the portion of the photoresist layer 120 left exposed by the light blocking mask 130 is then removed. Specifically, the exposed portion of the photoresist layer 120 may be removed by irradiating the exposed portion with an electron beam or with an exposure light of a given wavelength and then developing the photoresist layer 120. The residual photoresist layer 120 is covered by the light blocking mask 130 and thus, the residual photoresist layer 120 is not charged with electrons in the case in which an electron beam is used to remove the exposed portion of the photoresist layer 120.

Referring to FIG. 5C, an outer peripheral portion of the patterned chrome layer 110 exposed by the photoresist layer 120 is removed by wet etching or dry etching to form a chrome pattern 115 on the 0°-phase shift region 100a. The chrome pattern 115 exposes a border 100c of the 0°-phase shift region 100a adjacent the 180°-phase shift region 100b.

Figure 6:
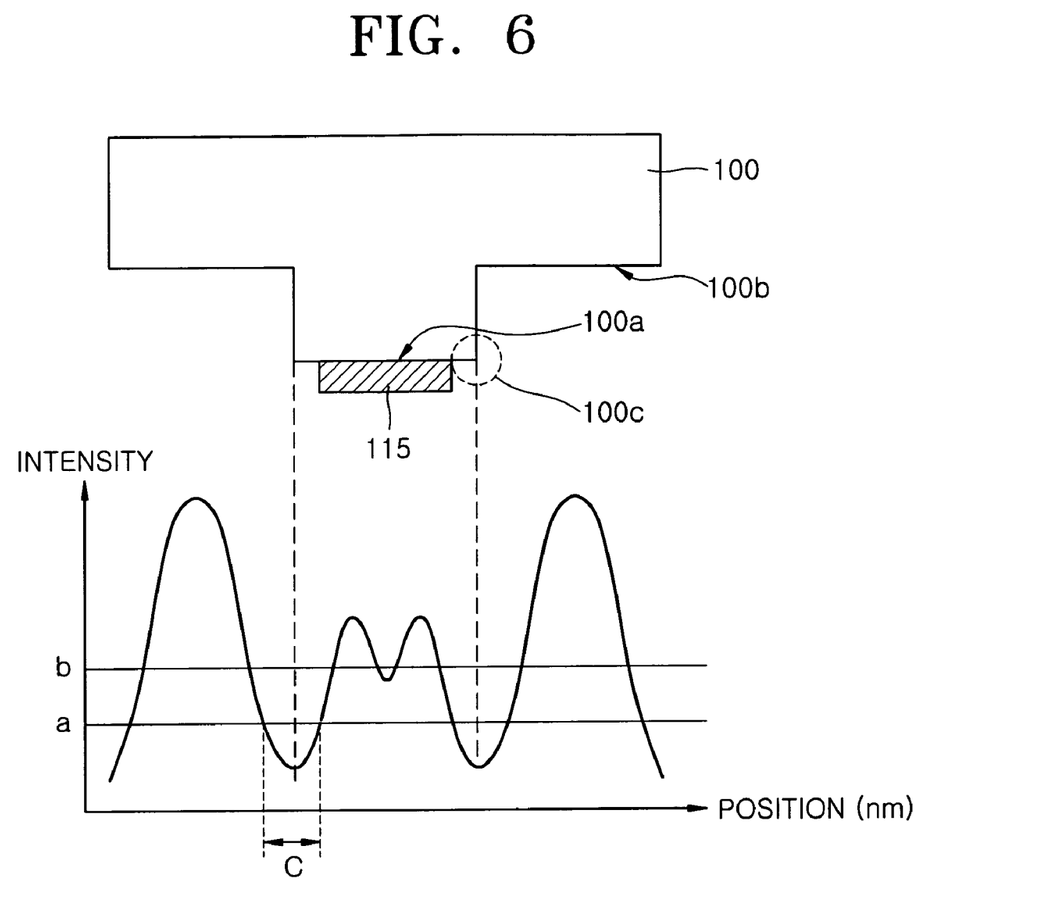
FIG. 6 is an explanatory diagram illustrating a rim type of photomask manufactured according to the present invention and the intensity distribution of light transmitted by the rim mask.

FIG. 6 illustrates a rim mask manufactured according to the present invention and the intensity distribution of the light that will be transmitted by the rim mask onto a layer of photoresist disposed on a semiconductor substrate so that the photoresist layer can be patterned. Referring to FIG. 6, light transmitted by the rim mask at the boundary between the 0°- and 180°-phase shift regions 100a and 100b experiences a phase shift. Meanwhile, the chrome pattern 115 formed on the 0°-phase shift region 100a affects the intensity of the light transmitted through the 0°-phase region 100a, as illustrated in FIG. 6. Specifically, if the exposure light has a certain initial intensity, features (e.g., lines) of the photoresist pattern may be formed only at regions of the photoresist layer corresponding to the border 100c of the 0°-phase shift region 100a. In the figure, the intensity level 'a' is that at which a photochemical reaction will take place in the photoresist layer, and which level is lower than the intensity level 'b' at which a phase shift occurs in light transmitted through the portion of the 0°-phase shift region 100a on which the chrome pattern 115 is situated. Thus, region C in FIG. 6 indicates the positions at which features, e.g., lines, of the photoresist pattern will be formed.

Figure 7:
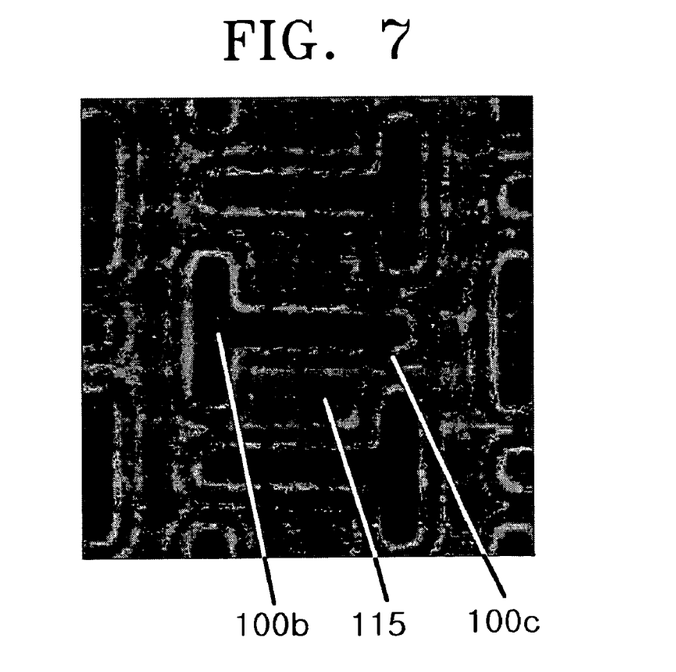
FIGS. 7 and 8 are photographs of rim types of photomasks manufactured according to the present invention.
Figure 8:
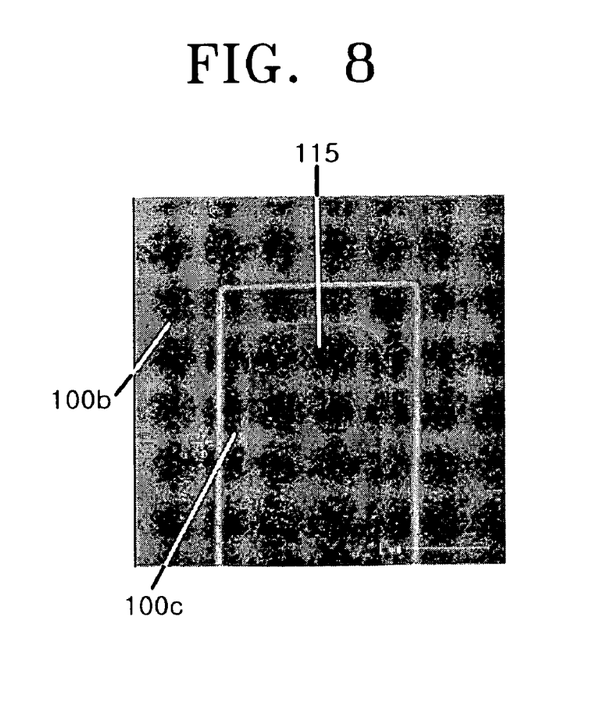

FIGS. 7 and 8 are photographs illustrating rim masks manufactured according to the present invention. In the rim mask shown in FIG. 7, the border 100c has a width of about 180 nm. In the rim mask shown in FIG. 8, the border 100c has a width of about 200 nm. As is quite clear from the photographs of FIGS. 7 and 8, the chrome patterns 115 are regular and the widths of each of the borders 100c are uniform.

As described above, according to the present invention, the 180°-phase shift region is defined and a thin photoresist layer having poor step coverage is formed on the quartz substrate including over the 0°-phase shift region covered by the patterned chrome layer. Accordingly, an outer peripheral region of the patterned chrome layer is exposed by the photoresist thin layer. The exposed portion of the patterned chrome layer is selectively removed to form a chrome pattern which exposes the substrate all along a border of the 0°-phase shift region. This border is exposed without subjecting the thin photoresist layer to a complete lithography process. Thus, the process of exposing the substrate at the border of the 0°-phase shift region is simple and the width of the border will be uniform.

In addition, the rim mask can be manufactured using only one electron beam lithography process, thereby minimizing the charging of the photoresist layer with electrons, and preventing the chrome pattern from being irregular. Also, the manufacturing process is comparatively simple with respect to the prior art due to the fact the present invention requires one less electron beam lithography process.

Finally, although the present invention has been particularly shown and described with reference to the preferred embodiments thereof, it will be understood that the present invention is not limited to the above-described embodiments. For example, a photoresist layer has been described above as the mask used for exposing the substrate at the border of the 0°-phase shift region. However, any fluid material, for example, a polymer or a spin on glass (SOG), having poor step coverage characteristics and a high etch selectivity with respect to the chrome layer can be used for forming the mask used to expose the substrate at the border of the 0°-phase shift region. Also, in the embodiments described above, a chrome pattern is formed on the 0°-phase region 100a to prevent light transmission. However, any opaque material, i.e., any material that can prevent the transmission of the exposure light, can be used instead of chrome. Accordingly, various changes and alternatives to aspects of the preferred embodiments described above are seen to be within the true spirit and scope of the present invention as defined by the following claims.

What is claimed is:

1. A method of manufacturing a rim type of photomask, comprising:

forming a light blocking layer, that is substantially opaque to an exposure light, on a quartz substrate;

patterning the light blocking layer and etching the quartz substrate to a predetermined depth to form a 180°-phase shift region constituted by the etched portion of the substrate;

subsequently depositing a fluid material on the quartz substrate thinly enough to have step coverage with respect to the topology of the substrate to thereby form a fluid material layer that covers a central portion of the patterned light blocking layer and leaves an outer peripheral portion of the patterned light blocking layer exposed;

subsequently etching the patterned light blocking layer to thereby form a light blocking pattern therefrom that remains over a portion of the surface of the substrate on which the light blocking layer was formed and exposes said surface along a border adjacent the 180°-phase shift region; and removing the fluid material layer.

2. The method of claim 1, wherein the forming of the 180°-phase shift region comprises:

forming a photoresist pattern on the light blocking layer;

etching the light blocking layer using the photoresist pattern as a mask;

etching the quartz substrate to a predetermined depth using the etched light blocking layer and the photoresist pattern as a mask; and removing the photoresist pattern.

3. The method of claim 1, wherein the depth, d, to which the substrate is etched to form the 180°-phase shift region satisfies the following equation $$d = \frac{\lambda}{2(\eta - 1)}$$

wherein $\lambda$ is the wavelength of the exposure light and $\eta$ is the refractive index of the quartz substrate.

4. The method of claim 1, wherein the fluid material is a photoresist.

5. The method of claim 4, wherein the thickness of the photoresist layer is 1000-5000 Å.

6. The method of claim 4, further comprising curing the photoresist layer.

7. The method of claim 1, further comprising increasing the width of the outer peripheral portion of the light blocking layer that is exposed by the fluid material layer, between the forming of the fluid material layer and the forming of the light blocking pattern.

8. The method of claim 7, wherein the increasing of the width of the outer peripheral portion of the light blocking layer that is exposed by the fluid material layer comprises treating the fluid material layer with an oxygen-based plasma or a developing solution.

9. A method of manufacturing a rim type photomask, comprising:

forming a light blocking layer, that is substantially transparent to an exposure light, on a quartz substrate;

patterning the light blocking layer and etching the quartz substrate to a predetermined depth to form a 180°-phase shift region constituted by a trench in the etched portion of the substrate;

subsequently forming a photoresist layer on the quartz substrate so thinly that the photoresist layer covers both a central portion of the patterned light blocking layer and a surface defining the bottom of the trench while at the same time leaving an outer peripheral portion of the patterned light blocking layer exposed and without the photoresist layer being charged with electrons;

subsequently etching the patterned light blocking layer to thereby form a light blocking pattern therefrom that remains over a portion of the surface of the substrate on which the light blocking layer was formed and exposes said surface along a border adjacent the 180°-phase shift region; and removing the photoresist layer.

10. The method of claim 9, wherein the forming of the 180°-phase shift region comprises:

forming a photoresist pattern on the light blocking layer;

etching the light blocking layer using the photoresist pattern as a mask;

etching the quartz substrate to a predetermined depth using the etched light blocking layer and the photoresist pattern as a mask; and removing the photoresist pattern.

11. The method of claim 9, wherein the depth, d to which the substrate is etched to form the 180°-phase shift region satisfies the following equation $$d = \frac{\lambda}{2(\eta - 1)}$$

where $\lambda$ is the wavelength of the exposure light and $\eta$ is the refractive index of the quartz substrate.

12. The method of claim 9, wherein the thickness of the photoresist layer is 1000 to 5000 Å.

13. The method of claim 9, further comprising curing the photoresist layer after the forming of the photoresist layer.

14. The method of claim 9, wherein the forming of the photoresist layer comprises forming an initial photoresist layer on the substrate that leaves an outer peripheral portion of the light blocking layer exposed, and subsequently increasing the width of the outer peripheral portion of the light blocking layer that is exposed between the forming of the initial photoresist layer and the forming of the light blocking pattern.

15. The method of claim 14, wherein the increasing of the width of the outer peripheral portion of the light blocking layer comprises treating the initial photoresist layer with an oxygen-based plasma or a developing solution.

16. A method of manufacturing a rim type of photomask, comprising:

forming a light blocking layer, that is substantially transparent to an exposure light, on a quartz substrate;

patterning the light blocking layer and etching the quartz substrate to a predetermined depth to form a patterned light blocking layer, and 180°-phase shift region constituted by trenches in the etched portions of the substrate;

subsequently forming a photoresist layer on the quartz substrate so thinly that the photoresist layer covers both central portions of respective features of the patterned light blocking layer and surfaces defining the bottoms of the trenches, respectively, while at the same time leaving outer peripheral portions of the features of the patterned light blocking layer exposed;

subsequently disposing a light blocking mask over only a portion of the substrate on which the features of the patterned light blocking layer is disposed so as to cover at least one of the features of the patterned light blocking layer and the portion of the photoresist layer disposed on said at least one of the features;

subsequently removing the portion of the photoresist layer that is not covered by the light blocking mask, thereby leaving a residual portion of the photoresist layer on said at least one of the features of the patterned light blocking layer;

etching the patterned light blocking layer using the residual portion of the photoresist layer as a mask to form a light blocking layer pattern; and removing the residual portion of the photoresist layer.

17. The method of claim 16, wherein the thickness of the photoresist layer is 1000 to 5000 Å.

18. The method of claim 16, wherein the forming of the photoresist layer comprises forming an initial photoresist layer on the substrate that leaves outer peripheral portions of the features of the light blocking layer exposed, and subsequently increasing the widths of the outer peripheral portions of the features of the light blocking layer that are exposed between the forming of the initial photoresist layer and the forming of the light blocking pattern.

19. The method of claim 18, wherein the increasing of the widths of the outer peripheral portions of the features of the light blocking layer comprises treating the initial photoresist layer with an oxygen-based plasma or a developing solution.

* * * * *